United States Patent
Bartsch et al.

(10) Patent No.: US 6,459,108 B1
(45) Date of Patent: *Oct. 1, 2002

(54) SEMICONDUCTOR CONFIGURATION AND CURRENT LIMITING DEVICE

(75) Inventors: Wolfgang Bartsch, Erlangen; Heinz Mitlehner, Uttenreuth; Dietrich Stephani, Bubenreuth, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 09/426,424

(22) Filed: Oct. 25, 1999

Related U.S. Application Data

(63) Continuation of application No. PCT/DE98/01030, filed on Apr. 9, 1998.

(30) Foreign Application Priority Data

Apr. 25, 1997 (DE) ........................................ 197 17 614

(51) Int. Cl.[7] ........................... H01L 29/80; H01L 29/00
(52) U.S. Cl. .................... 257/263; 257/528; 257/266
(58) Field of Search ............................... 257/263–266, 257/287, 528; 361/78, 84

(56) References Cited

U.S. PATENT DOCUMENTS 5,895,939 A * 4/1999 Ueno ........................ 257/279
6,034,385 A * 3/2000 Stephani et al. ............ 257/263
6,097,046 A * 8/2000 Plumton .................... 257/266
6,188,555 B1 * 2/2001 Mitlehner et al. ........... 361/84

FOREIGN PATENT DOCUMENTS

| DE | 9411601.6 | 10/1994 | |
| FR | 92860 | 12/1968 | |
| JP | 3-57282 | * 3/1991 | ........... H01L/39/16 |
| WO | 95/07548 | 9/1993 | |
| WO | 96/19831 | 6/1996 | |
| WO | 97/23911 | 7/1997 | |

OTHER PUBLICATIONS

"Polyäthylen–Stromwächter für den Kurzschlussschutz" [Polyethylene Current Monitor For Short–Circuit Protection] (Hansson), ABB Technik Apr. 1992, pp. 35–38.

* cited by examiner

*Primary Examiner*—Steven Loke
*Assistant Examiner*—Ori Nadav
(74) *Attorney, Agent, or Firm*—Laurence A. Greenberg; Werner H. Stemer; Ralph E. Locher

(57) ABSTRACT

The semiconductor configuration is formed with a lateral channel region and an adjoining vertical channel region in an n-conductive first semiconductor region. When a predetermined saturation current is exceeded, the lateral channel region is pinched off and the current is limited to a value below the saturation current.

17 Claims, 7 Drawing Sheets

SEMICONDUCTOR CONFIGURATION AND CURRENT LIMITING DEVICE

CROSS-REFERENCE TO RELATED APPLICATION

This is a continuation of copending International Application PCT/DE98/01030, filed Apr. 9, 1998, which designated the United States.

BACKGROUND OF THE INVENTION

Field of the Invention

The invention lies in the semiconductor technology field. More specifically, the invention relates to a semiconductor configuration suitable for passively limiting an electric current, and to an implementation of the novel configuration.

To supply an electrical consumer (load device) with an electric current, the consumer is connected to a line branch of an electrical supply network via a switching device. To protect the consumer against excessive currents, particularly in the event of a short circuit, low-voltage technology uses a switching device with an isolator, for which a fuse is generally used, protecting the line branch and with a mechanical power switch having a switching time of markedly more than one millisecond (1 ms). If a plurality of consumers are operated at the same time in a line branch and a short circuit occurs in only one of these consumers, then it is greatly advantageous if the consumers not affected by the short circuit can continue to operate without fault and only the consumer affected by the short circuit is switched off. To this end, current-limiting components (limiters) connected immediately upstream of each consumer are required. Each of the current limiters reliably limit the current of the prospective short-circuit current to a predetermined, noncritical overcurrent value within a time of markedly less than 1 ms, and hence before the isolator provided for the line branch is triggered. In addition, these current-limiting components should work passively without any driving and should be able to tolerate voltages of, typically, up to 700 V and from time to time up to 1200 V which are present during current limiting. Since the power loss which then occurs in the component is very high, it would be particularly advantageous if the passive current limiter were also to reduce the current to values markedly below the predetermined overcurrent value automatically, with additional voltage uptake (intrinsically safe component).

The only commercially available passive current limiter known to the inventors is a device described by T. Hansson in a paper titled "Polyethylen-Stromwächter für den Kurzschlußschutz" [Polyethylene current monitor for short-circuit protection], ABB Technik 4/92, pages 35–38. That device is distributed under the product name PROLIM and is based on current-dependent conductivity of the grain boundaries of the material used in the device. When the device is used relatively frequently for current limiting, however, the current saturation value at which the current is limited may be changed.

Otherwise, only active current limiters are used in general, which detect the current and limit it by active control if a predetermined maximum current value is exceeded. Such a semiconductor-based active current limiter is described in German published patent application DE 43 30 459. That device has a first semiconductor region of a predetermined conductivity type which is allocated a respective electrode on mutually remote surfaces. In the first semiconductor region, further semiconductor regions of the opposite conductivity type are formed at a distance from one another between the two electrodes. Channel regions of the first semiconductor region are formed between each of the further semiconductor regions and are oriented perpendicularly to the two surfaces of the first semiconductor region (vertical channels). A vertical flow of current between the two electrodes is routed through these channel regions and limited thereby. To control the flow of current between the two electrodes, a gate voltage is applied to the oppositely doped semiconductor regions in the first semiconductor region. The gate voltage controls the resistors in the channel regions.

SUMMARY OF THE INVENTION

It is accordingly an object of the invention to provide a semiconductor configuration, which overcomes the above-mentioned disadvantages of the heretofore-known devices and methods of this general type and which can be used for passively limiting electric currents when a critical current value is exceeded. It is a further object of the invention to provide a current limiter device with such a semiconductor configuration.

With the foregoing and other objects in view there is provided, in accordance with the invention, an claim 1.

A semiconductor configuration, comprising:
a first electrode and a second electrode;
a first semiconductor region having a first surface formed with at least one contact region in contact with the first electrode, having a second surface in contact with the second electrode, and defining a current path between the first and second electrodes;
a second semiconductor region disposed to form a p-n junction with the first semiconductor region and an associated depletion zone;
a third semiconductor region disposed to form a p-n junction with the first semiconductor region and an associated depletion zone;
the third semiconductor region having a surface not adjoining the first semiconductor region an being insulated for charge storage charges in the third semiconductor region;
the first semiconductor region being formed with at least one channel region in the current path between the first and second electrodes and, upon attaining a predetermined saturation current between the first and second electrodes, the depletion zones of the p-n junctions pinching off the channel region and limiting the current to a value below the saturation current.

In other words, the novel semiconductor configuration is formed with:

a) a first semiconductor region, which, on a first surface, is in contact with a first electrode in at least one contact region, and is in contact with a second electrode on a second surface;

b) at least one second semiconductor region, which forms a p-n junction with the first semiconductor region;

c) at least one third semiconductor region, which forms a p-n junction with the first semiconductor region;

where d) the third semiconductor region is insulated on its surface not adjoining the first semiconductor region, so that electrical charges can be stored in the third semiconductor region; and e) the first semiconductor region has at least one channel region which is situated in a current path between the two electrodes and, when a predetermined saturation current is reached between the two electrodes, is pinched off by depletion zones of said p-n junctions, after which the current is limited to a value below the saturation current.

This semiconductor configuration uses an advantageous combination of physical effects in the channel region to limit a current, particularly a short-circuit current, to an acceptable current value automatically and without active driving. In addition, the semiconductor configuration can, in principle, maintain this acceptable current value, on account of the charge storage in the electrically insulated third semiconductor region and the resultant continuous pinch-off of the channel region, even with subsequent voltage reductions at the two electrodes.

In accordance with an added feature of the invention, the second semiconductor region is formed inside the first semiconductor region below the contact region and projects beyond the contact region in all directions parallel to the surface of the first semiconductor region. This embodiment reaches particularly high breakdown strength.

The third semiconductor region preferably surrounds the contact region parallel to the first surface of the first semiconductor region.

In accordance with an additional feature of the invention, the second surface of the first semiconductor region is remote from and facing away from the first surface. This feature results in a vertical and thus particularly surge-proof design.

In accordance with another feature of the invention, the at least one contact region is one of a plurality of contact regions on the first surface. In other words, the first surface is preferably provided with a plurality of contact regions which, in particular, are allocated a common electrode.

In accordance with a further feature of the invention, a cohesive second semiconductor region is formed below the contact regions, and the cohesive second semiconductor region projects beyond all of the contact regions in all directions parallel to the first surface of the first semiconductor region.

The cohesive semiconductor region is preferably formed with openings through which further channel regions electrically connected in series with the aforementioned channel regions run in the first semiconductor region, preferably vertically. That is, in other words, the first semiconductor region has channel regions running through respective openings formed in the cohesive second semiconductor region, the channel regions being electrically connected in series, in the current path, with at least one respective channel region associated with the contact regions.

Alternatively, a respective associated second semiconductor region can be arranged below each contact region in the first semiconductor region, between which additional channel regions of the first semiconductor region run which are electrically connected, in the current path, in series with at least one, respectively, of the channel regions associated with the contact regions.

In accordance with again an added feature of the invention, an insulator region covers a surface of the third semiconductor region not adjoining the first semiconductor region. In that case, each third semiconductor region is covered by an insulator region on its surface not adjoining the first semiconductor region. The dielectric strength of the insulator region is preferably at least 20 V, in particular at least 50 V, between the first electrode and the third semiconductor region, and the electric breakdown field strength is preferably at least 5 MV/cm.

In accordance with again an additional feature of the invention, the semiconductor regions are formed from silicon carbide, and the insulator region is formed of silicon dioxide. More generally, the semiconductor used for the semiconductor configuration is preferably a semiconductor having an energy gap of at least 2 eV, which is distinguished by a low intrinsic charge carrier concentration (charge carrier concentration without doping), which in turn has a positive influence on the charge storage effect. The charge storage effect is particularly high if the semiconductor material provided for the semiconductor regions of the semiconductor configuration is silicon carbide (SiC), since SiC has an extremely low intrinsic charge carrier concentration. Further advantages of SiC are its high breakdown strength, high thermal resistance, chemical resistance and high thermal conductivity. Preferred polytypes of SiC are the 4H, 6H and 3C polytype. Preferred dopants for SiC are boron and aluminum for p-doping and nitrogen for n-doping. However, other semiconductors are also suitable, particularly silicon (Si).

Both with SiC and Si as the semiconductor, the insulator region used is preferably the dielectric silicon dioxide ($SiO_2$). In a preferred embodiment, the silicon dioxide is grown thermally. Thermal oxide has excellent insulation properties. It is produced on SiC preferably by dry or wet oxidation at temperatures above 1000° C., for example.

With the above and other objects in view there is provided, in accordance with the invention, a current limiter for limiting DC currents between a current source and an electrical consumer. The limiter device comprises the above-described semiconductor configuration with its first electrode electrically connected to the current source and the second electrode electrically connected to the consumer.

In a further development, there is also provided a current limiter for limiting AC currents between a current source and an electrical consumer. That device is formed by reverse-connecting in series two of the above-outlined semiconductor configurations between the current source and the consumer. Charge storage in the third semiconductor regions prevents the current from being repeatedly connected when the AC voltage changes polarity.

Other features which are considered as characteristic for the invention are set forth in the appended claims.

Although the invention is illustrated and described herein as embodied in a semiconductor configuration and current limiting device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
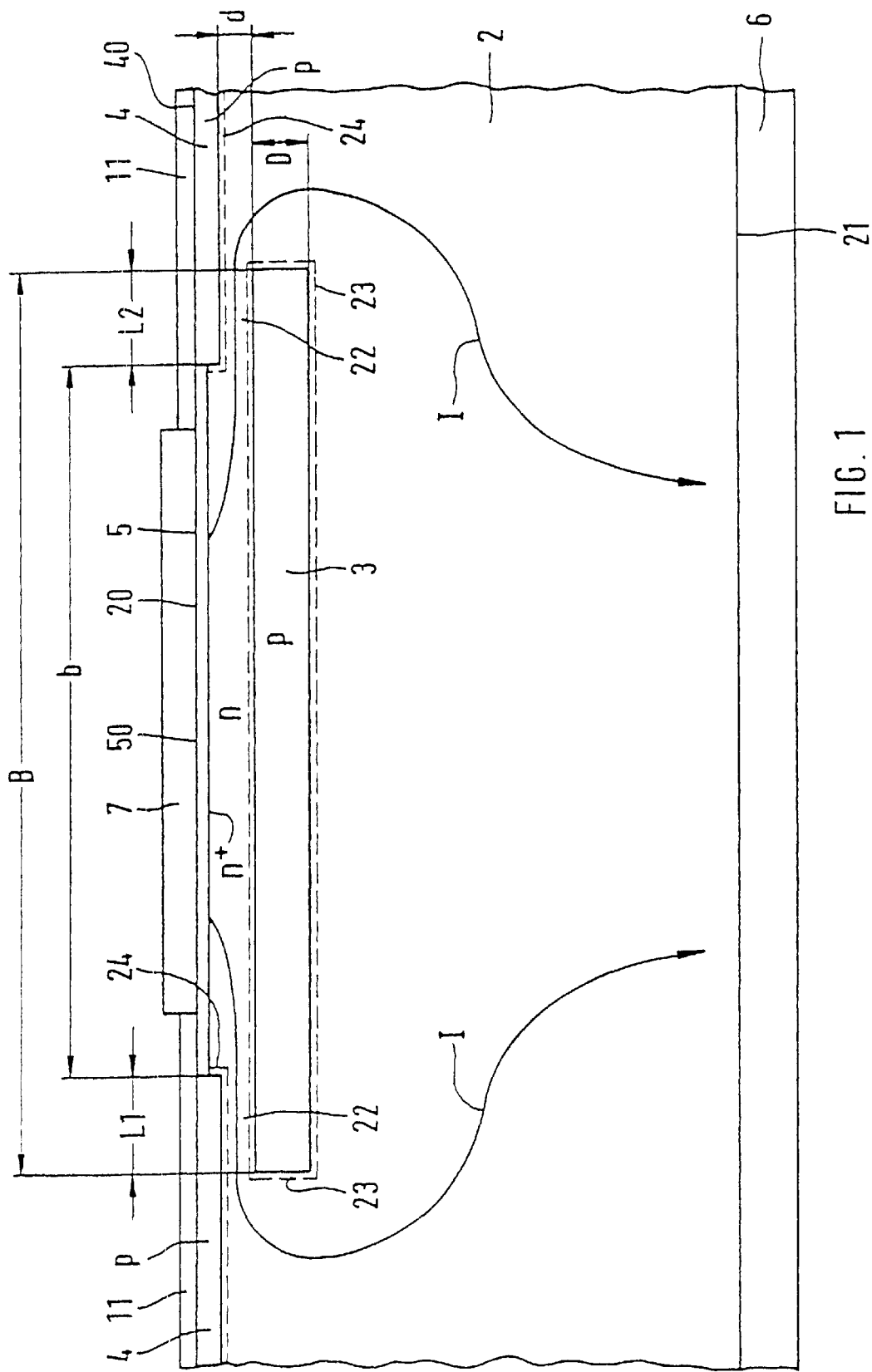
FIG. 1 is a diagrammatic side view of an embodiment of a semiconductor configuration with a lateral channel region.

Referring now to the figures of the drawing in detail and first, particularly, to FIG. 1 thereof, there is seen a semiconductor configuration which comprises a first semiconductor region 2 of the n conductivity type (electron conduction) and a second semiconductor region 3 and a third semiconductor region 4 of the p conductivity type (hole conduction). The first semiconductor region 2 has a planar (even) surface 20. The second semiconductor region 3 is arranged below the surface 20 inside the first semiconductor region 2 and runs laterally at least on its side facing the surface 20 of the first semiconductor region 2, i.e. essentially parallel to the surface 20 of the first semiconductor region 2. The second semiconductor region 3 is preferably produced by ion implantation of dopant particles into the surface 20 of the first semiconductor region 2. A desired doping profile is set by the penetration profile during ion implantation by means of the ion energy, taking into account possible implantation masks. In particular, this produces the depth of the second semiconductor region 3, i.e. the distance of the second semiconductor region 3 from the surface 20 of the first semiconductor region 2, and the vertical extent D, i.e. the height measured perpendicularly to the surface 20 of the first semiconductor region 2, of the second semiconductor region 3. The vertical extent D is, in particular, between 0.1 $\mu$m and 1.0 $\mu$m. The lateral extent of the second semiconductor region 3 parallel to the surface 20 of the first semiconductor region 2 in the cross section shown is denoted by B, and is generally selected to be between about 10 $\mu$m and about 30 $\mu$m. Between the first semiconductor region 2 and the oppositely doped second semiconductor region 3, a p-n junction is formed whose depletion zone (space charge zone) is denoted by 23. The depletion zone 23 of the p-n junction surrounds the entire second semiconductor region 3.

The surface 20 of the first semiconductor region 2 is provided with a contact region 5 as a resistive contact. The contact region 5 is preferably relatively highly doped and of the same conductivity type as the first semiconductor region 2, indicated by n+ in the illustrative embodiment shown, and can be produced, in particular, by ion implantation. A free surface 50 of the contact region 5 has a first electrode 7, for example made of polysilicon or a metal. The lateral extent of the contact region 5 in the cross section shown is denoted by b and is smaller than the lateral extent B of the second semiconductor region 3 in all directions parallel to the surface 20 of the first semiconductor region 2. The lateral extent b of the contact region is best chosen between about 6 $\mu$m and about 28 $\mu$m. The second semiconductor region 3 and the contact region 5 are arranged in relation to one another such that, in a projection perpendicular to the surface 20 of the first semiconductor region 2, the projection of the contact region 5 lies completely within the projection of the second semiconductor region 3.

The third semiconductor region 4 is also arranged on the surface 20 of the first semiconductor region 2 and preferably also produced by ion implantation. Between the first semiconductor region 2 and the third semiconductor region 4, a p-n junction is formed whose depletion zone is denoted by 24. The extents of the depletion zones 23 and 24 are dashed and shown only in the first semiconductor region 2. Of course, the depletion zones 23 and 24 also extend into the respective p-semiconductor regions 3 and 4. The extent of each depletion zone of a p-n junction into the p-region and the n-region depends on the charge carrier concentrations produced by the doping concentrations, in accordance with Poisson's law and the charge retention principle. The doping of the first semiconductor region 2, the second semiconductor region 3 and the third semiconductor region 4 determines the blocking ability of the semiconductor configuration when a voltage is applied in the reverse direction between the two electrodes 6 and 7.

After ion implantation in the semiconductor regions 3, 4 and 5, thermal annealing processes are generally carried out in order to reduce lattice defects.

On the free surface 40, not adjoining the first semiconductor region 2, of the third semiconductor region 4, there is an insulator region 11 which also covers an adjoining edge region of the contact region 5. The insulator region 11 electrically insulates the third semiconductor region 4 and prevents a flow of charges (electrons in the case shown) from the third semiconductor region 4, which have diffused out of the depletion zone 23 of the p-n junction into a space charge zone in the third semiconductor region 4. A further function of the insulator region 11 is electrical insulation of the third semiconductor region 4 from the first electrode 7.

The third semiconductor region 4 is also laterally offset with respect to the second semiconductor region 3 such that the two semiconductor regions 3 and 4 overlap along a length L1 on one side and a length L2 on the other side in a projection onto the surface 20 of the first semiconductor region 2. This forms at least one laterally extending semiconductive channel region 22 in the first semiconductor region 2 between the two p-doped semiconductor regions 3 and 4. The lateral extents L1 and L2 of the channel region 22 on different sides of the contact region 5 can be of the same size or else of different sizes.

Typically, the channel lengths L1 and L2 are between 1 mm and 5 mm. The vertical extent d (channel height) of the channel region 22 is defined by the distance of the second semiconductor region 3 from the third semiconductor region 4 and is generally selected to be between 0.1 $\mu$m and 1 $\mu$m.

The third semiconductor region 4 laterally surrounds the contact region 5 and directly adjoins the contact region 5, so that L1+b+L2=B is true for the lateral extents L1, L2, b and B. Alternatively, the contact region 5 can be at a lateral distance from the third semiconductor region 4.

Since the depletion zones 23 and 24, extending into the channel region 22, of the p-n junctions between the semiconductor regions 2 and 3 or 2 and 4, respectively, have a significantly higher electrical resistance than the first semiconductor region 2, owing to the high depletion of charge carriers, essentially only the inner area of the channel region 22 is able to carry current, said inner area being bounded at the bottom by the depletion zone 23 and at the top by the depletion zone 24.

On a further surface 21 of the first semiconductor region 2, said surface 21 being remote from the surface 20 of the first semiconductor region 2, there is a second electrode 6. A forward operating voltage is applied to the semiconductor configuration between this second electrode 6 and the first electrode 7. The first electrode 7 is then connected to the cathode and the second electrode 6 is connected to the anode of the operating voltage source. If the conductivity types of the semiconductor regions are transposed, the polarity of the operating voltage is transposed accordingly.

The behavior of the semiconductor configuration when a forward operating voltage is applied now depends on the electric current I flowing through the semiconductor configuration between the electrodes 6 and 7. The electric current I flows between the two electrodes 6 and 7 along a current path (indicated by arrows), firstly essentially laterally through the channel region 22 in the first semiconductor region 2 and then essentially vertically through the bulk area of the first semiconductor region 2. As the current level I rises, the forward voltage drop between the electrodes 6 and 7 increases, so that the second semiconductor region 3 and the third semiconductor region 4 are negatively biased with respect to the second electrode 6. The increased forward voltage drop appears as a relatively high reverse voltage at the p-n junctions between the first semiconductor region 2 and the second semiconductor region 3 or the third semiconductor region 4, respectively, and thus causes the depletion zones 23 and 24 to be enlarged.

This results in a reduction in the cross section and a corresponding increase in the resistance of the semiconductive area of the channel region 22. When a particular critical current value (saturation current) $I_{Sat}$ is reached, the depletion zones 23 and 24 touch and pinch off the channel region 22 completely. The now significantly higher electrical resistance in the channel region 22 now causes the current to reach saturation and, if the voltage between the electrodes 6 and 7 remains the same, to remain at the saturation current value $I_{Sat}$. The saturation current $I_{Sat}$ of the semiconductor configuration is set to a desired value by the geometrical dimensions of the channel region 22, particularly its lateral extents L1 and L2 and vertical extent d, as well as by the charge carrier concentration, defined by the doping, of the channel region 22.

If, on the other hand, such as in the event of a short circuit, the voltage between the electrodes 6 and 7 rises further after the current I has already reached the saturation current value $I_{Sat}$, the electrical power loss in the channel region 22 increases, and the channel region 22 becomes hot. With the increasing internal temperature in the channel region 22, the mobility of those charge carriers which have remained in the depletion zones 23 and 24 covering the channel region 22 is now reduced. The conductivity of the channel region 22 is thus further reduced, which means that, owing to the resulting higher forward voltage drop between the electrodes 6 and 7, the mobile charge carriers are depleted from the depletion zones 23 and 24 in the channel region 22 to a greater extent, and, in particular, the space charge zone in the third semiconductor region 4 grows. Owing to this feedback effect, the semiconductor configuration also quickly limits a steeply rising electric current, as in the event of a short circuit, to a noncritical current value $I_B$, which is essentially equivalent to the reverse current of the semiconductor configuration at the desired reverse voltage, which is between about 700 V and about 1200 V, for example.

Due to the fact that the third semiconductor region 4 is electrically insulated by the insulator region 11, the charge carriers present in the space charge zone in the third semiconductor region 4 continue to be stored. The leakage currents in the insulator region 11 should be as small as possible in order to ensure good charge storage in the third semiconductor region 4. The buried second semiconductor region 3 also stores the accumulated space charge. This charge storage essentially maintains the electric potential in the second semiconductor region 3 and in the third semiconductor region 4 even when the voltage between the two electrodes 6 and 7 falls again, and the channel region 22 remains closed. The semiconductor configuration thus limits the current I to the reverse current $I_B$ quickly and reliably.

The semiconductor for the semiconductor regions 2, 3 and 4 of the semiconductor configuration is silicon carbide (SiC). Dopants for SiC are boron and aluminum for p-doping and nitrogen for n-doping. For the insulator region 11, the dielectric silicon dioxide ($SiO_2$) is used. In particular, the silicon oxide layer is thermally grown. Thermal oxide has excellent insulation properties and can be produced on SiC by dry or wet oxidation at temperatures above 1000° C., for example.

Figure 2:
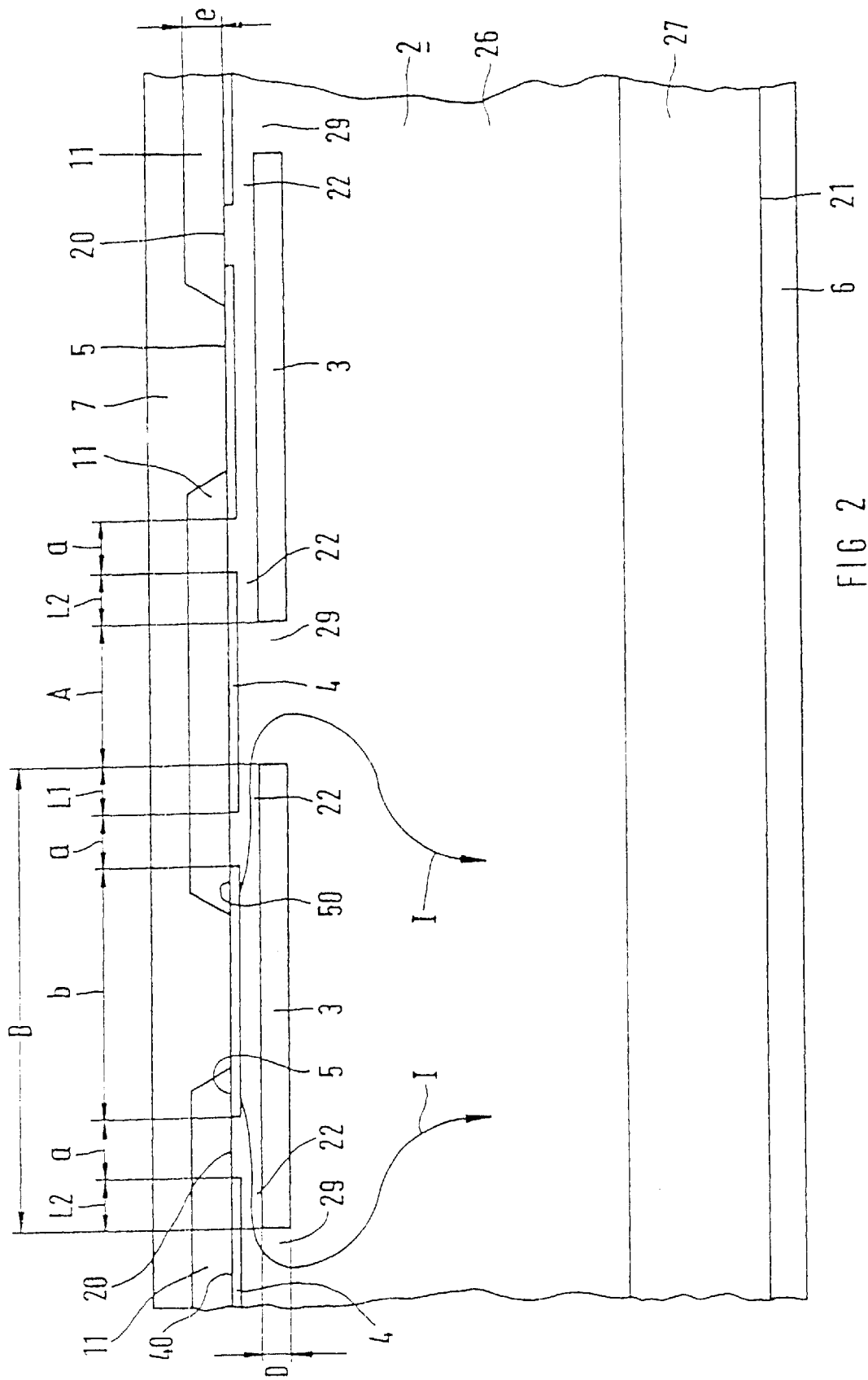
FIG. 2 is a diagrammatic side view of an embodiment of a semiconductor configuration with lateral and vertical channel regions.

Referring now to FIG. 2, there is shown a semiconductor configuration in which the first semiconductor region 2 is composed of a substrate 27 and a semiconductor layer 26 on the substrate 27. The layer 26 is grown epitaxially and is of the same conductivity type as the substrate 27. On the surface 20 of the semiconductor layer 26, there are a plurality of contact regions 5 at a distance from one another, which are doped in the same way but more highly and of which only two are shown. Below the contact regions 5, buried in the semiconductor layer 26, there is a second semiconductor region 3 in each case, with opposite doping to the semiconductor layer 26, or a subregion of a cohesive second semiconductor region 3 in each case. Between the contact regions 5, there is, in each case at a lateral distance and preferably at the same distance a, a third semiconductor region 4, of opposite doping to the semiconductor layer 26, arranged on the surface 20 of the semiconductor layer 26. The lateral spacing distance a of the contact regions 5 from the third semiconductor regions 4 is generally between about 1 μm and about 3 μm.

A dielectric layer is applied to the surface 20 of the semiconductor layer 26 as an insulator region 11. On this insulator region 11, there is an electrically conductive layer, preferably made of metal or polysilicon, which is in contact with the contact regions 5 through openings in the insulator region 11 as a common electrode 7.

The semiconductor regions 3 and 4 each run essentially laterally to the surface 20 of the first semiconductor region 2. In a projection along a direction perpendicular to the surface 20, a respective semiconductor region 4 overlaps two of the semiconductor regions 3 in each case, and each semiconductor region 3 overlaps two of the semiconductor regions 4 in each case. This means that, as in FIG. 1, laterally running channel regions 22 with the lateral channel lengths L1 and L2 are once again formed in the semiconductor layer 26 between a respective second semiconductor region 3 and a respective third semiconductor region 4. The lateral extent B of the buried second semiconductor regions 3 is B=b+2a+L1+L2. On that side of the substrate 27 which is remote from the semiconductor layer 26, as the second surface 21 of the first semiconductor region 2, there is again an electrode 6. The operating voltage for the semiconductor configuration is applied between the electrode 6 and the electrode 7. The buried semiconductor regions 3 are at a lateral distance from one another, preferably at the same distance A, or openings with a respective lateral extent A are formed in a cohesive second semiconductor region 3. As a result, a respective channel region 29 of the first semiconductor region 2 is formed between the two semiconductor regions 3 by the lateral extent A and the vertical extent D, the channel region 29 running essentially vertically to the surface 20. The semiconductive area in each channel region 29 is bounded laterally by the (non-illustrated) depletion zones of the p-n junctions formed by the semiconductor layer 26 and the second semiconductor regions 3.

The lateral extent A of the vertical channel regions 29 is preferably chosen to be so small that the maximum reverse voltage which can be applied between the two electrodes 6 and 7 is at least essentially equivalent to the maximum bulk reverse voltage which the p-n junction between the semiconductor regions 2 and 3 can carry on the underside of the second semiconductor regions 3. This corresponds to an at least essentially planar curve for the equipotential lines in the blocking case (reduced voltage punch-through). Typical values for the lateral extent A are between 1 μm and 10 μm. The thickness e of the insulator region 11 is chosen to be sufficiently large so that, with vertical channel regions 29 chosen to be correspondingly narrow (small A), a potential difference of 50 V between the third semiconductor regions 4 and the electrode 7 is not exceeded.

When an operating voltage is applied in the forward direction, a current I flows between the electrode 7 and the electrode 6 along the arrows shown. The current first runs through the lateral channel regions 22 and then, in a virtually vertical direction with respect to the surface 20, through the vertical channel regions 29 in the semiconductor layer 26 and then essentially vertically through the semiconductor layer 26 and the substrate 27 to the second electrode 6.

Figure 3:
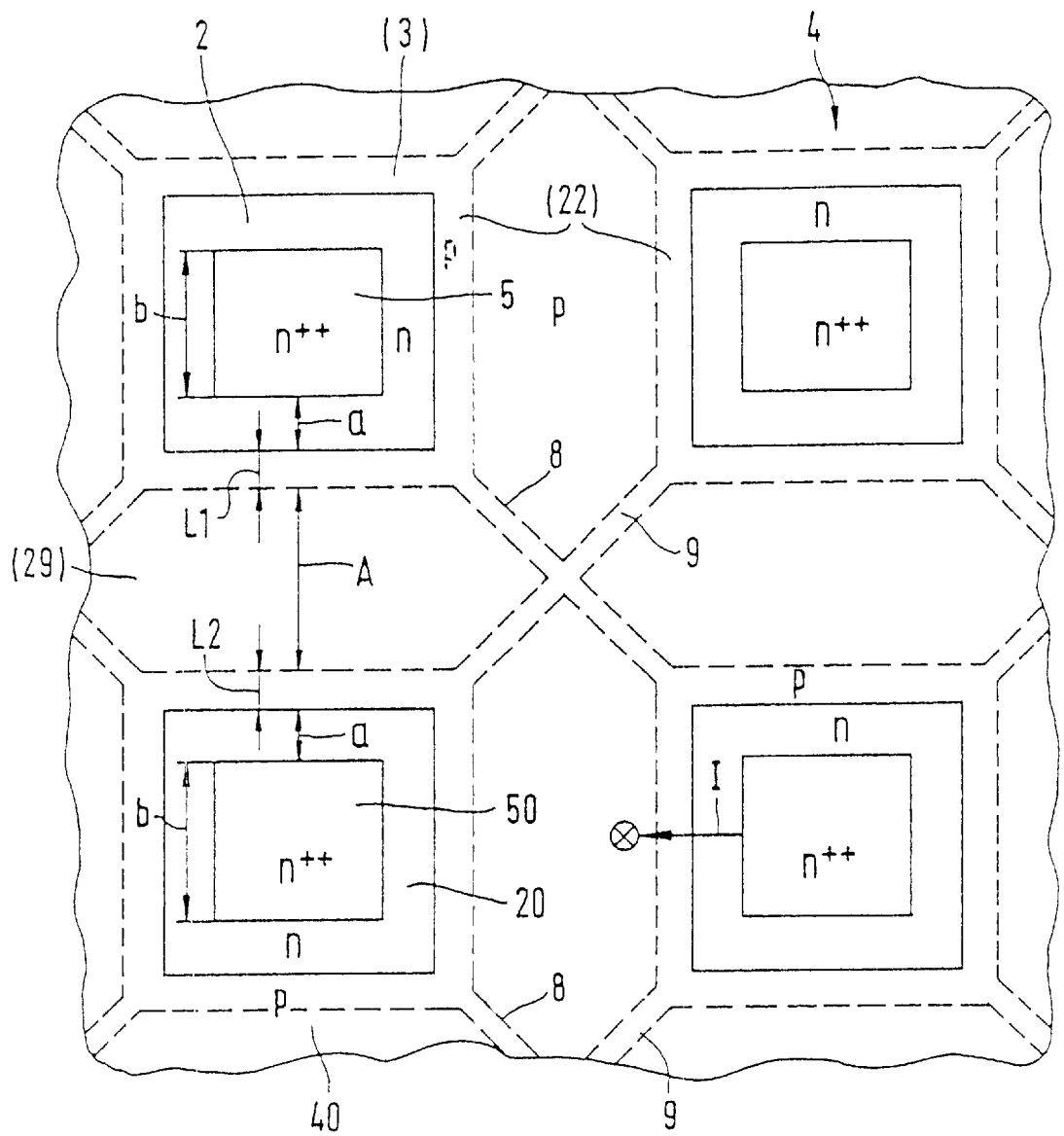
FIG. 3 is a partial plan view of a semiconductor configuration with a cellular layout design.

Referring now to FIG. 3, there is shown an embodiment of a semiconductor configuration in a plan view of the semiconductor surface without electrode and insulator. In a cellular design, there are a plurality of at least approximately square cells comprising a respective n++-doped source region, as contact region 5, which is formed as a square having sides of length b and is implanted in an n-doped semiconductor layer as first semiconductor region 2, a p-doped third semiconductor region 4, which surrounds the n++ contact region 5 at a distance a, and a p-doped second semiconductor region 3 (shown in dashes) buried below the contact region 5 by implantation. The third semiconductor region 4 having the surface 40 is preferably implanted on the entire surface 20 of the first semiconductor region 2 with the exception of the square cutouts for the contact regions 5 having the surfaces 50 and the subregions of the surface 20 of the first semiconductor region 2, which surround the contact regions 5. In the square annular overlap region of width L1 or L2, a respective channel region 22 is again formed below the third semiconductor region 4 and above the second semiconductor region 3. To bring the buried second semiconductor regions 3 to a common potential, these second semiconductor regions 3 are connected to one another via p-doped connections 8 and 9, running in a cross, in the first semiconductor region 2. Between the connections 8 and 9 and the adjacent third semiconductor regions 3, there is a respective continuous channel region 29, roughly in the form of a rhombus of width A, running vertically with respect to the surface 40 or 20 in the first semiconductor region 2 below the third semiconductor region 4. The current I flows from the contact regions 5 first laterally (i.e. across or horizontally) through the lateral channel region 22 and then approximately vertically through the adjacent vertical channel regions 29.

For the semiconductor material SiC, the following dopant concentrations are chosen:

For the first semiconductor region 2, particularly the semiconductor layer 26, between approximately $1\times10^{16}$ cm$^{-3}$ (for a reverse voltage of about 700 V) and approximately $6\times10^{15}$ cm$^{-3}$ (for a reverse voltage of about 1200 V), for the substrate 27, also significantly more than $10^{18}$ cm$^{-3}$, and for the second semiconductor regions 3 and the third semiconductor regions 4, between approximately $1\times10^{18}$ cm$^{-3}$ and approximately $2\times10^{19}$ cm$^{-3}$, preferably approximately $5\times10^{16}$ cm$^{-3}$.

All the embodiments described for the semiconductor configuration can be designed with different topologies, particularly with a cellular design or else with a comb-like structure.

The semiconductor configurations described up to now are unipolar components, which are excellently suitable for limiting short-circuit DC currents and in so doing operate intrinsically safely and without driving (passively). The design of the semiconductor configuration as a current limiter can be used to set a desired saturation current $I_{Sat}$ which is above a rated current range and also a regular, still tolerable overcurrent range and after which the semiconductor configuration automatically limits the current to the smaller reverse current $I_B$ by taking up voltage.

In a non-illustrated embodiment of a current limiter which is also suitable for AC voltages, a series circuit comprising a first semiconductor configuration as shown in FIG. 1 or FIG. 2 and a first diode for the reverse voltage and a further series circuit comprising a second semiconductor configuration as shown in FIG. 1 or FIG. 2 and a second diode for its reverse voltage are connected in parallel in opposite directions. The two diodes can be p-n rectifier diodes or else Schottky diodes. These are based, in particular, on silicon carbide SiC. The characteristic curve for this AC limiter is then burdened by diode threshold voltages.

Figure 4:
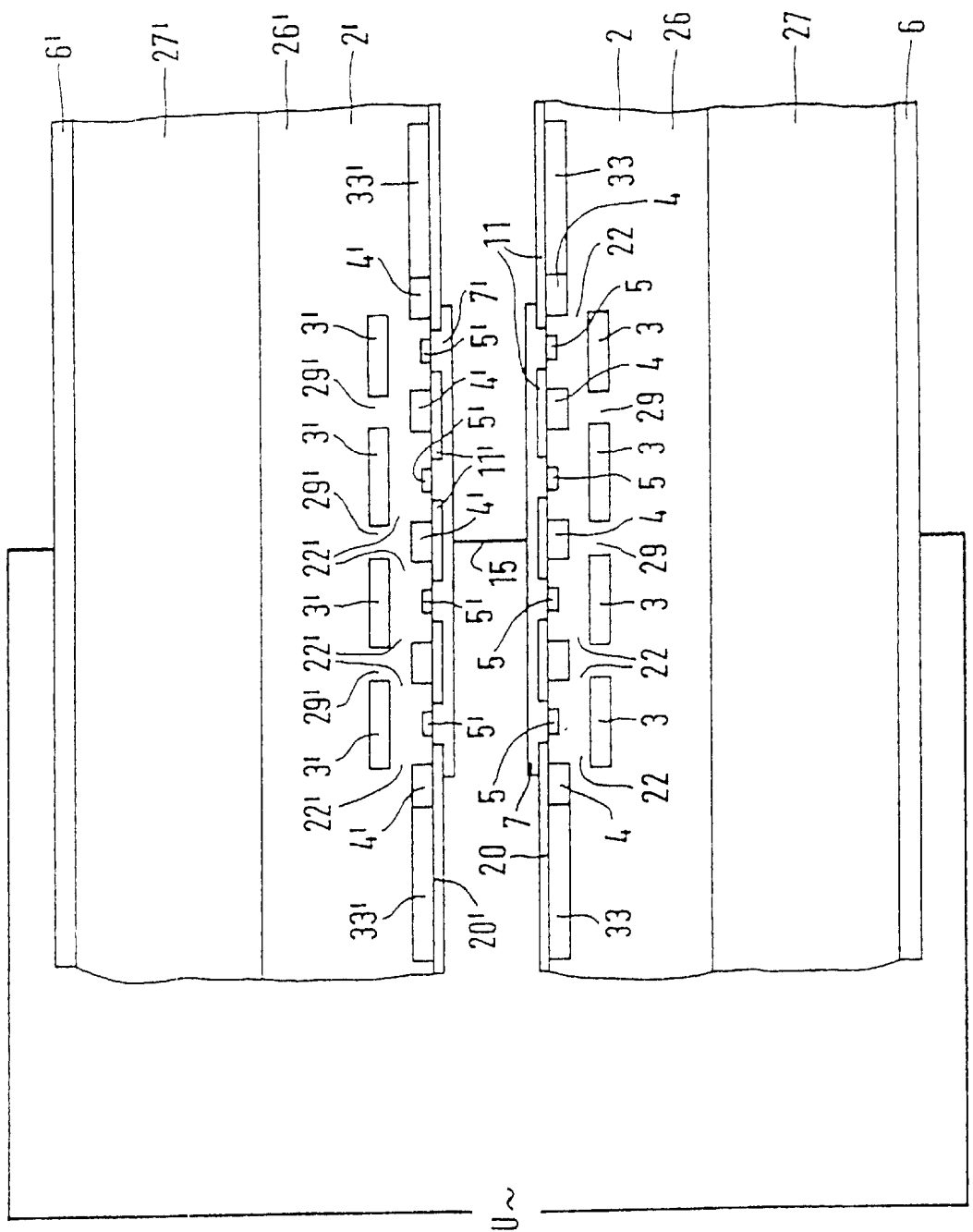
FIG. 4 is a diagrammatic side view of an AC limiter with two reverse-connected series semiconductor configurations.

One particularly advantageous embodiment of an AC limiter is shown in FIG. 4. Two identical semiconductor configurations of similar design to that in FIG. 2 are reverse-connected in series, so that each of the two semiconductor configurations limits a short-circuit half-cycle (current polarity). To this end, the first electrodes 7 and 7' of the two semiconductor configurations are in electrical contact with one another via an electrical connection 15, and the two second electrodes 6 and 6' are each electrically connected to one pole of the AC voltage. Unlike in the embodiment shown in FIG. 2, the third semiconductor regions 4 and 4' are designed to be deeper than the contact regions 5 and 5', and the channel regions 22 and 29 are of geometrically different design. In addition, the outermost third semiconductor regions 4 and 4' are bounded by a two-dimensional peripheral termination, of opposite doping to the semiconductor layer 26 and 26', respectively, for reducing the field strength at the surface 20 or 20' and passivation. In the event of a short circuit, the charge storage effect in the third semiconductor regions 4 and 4' prevents repeated turning-on during the ensuing AC voltage periods, so that the current remains limited to the small reverse current $I_B$.

Figure 5:
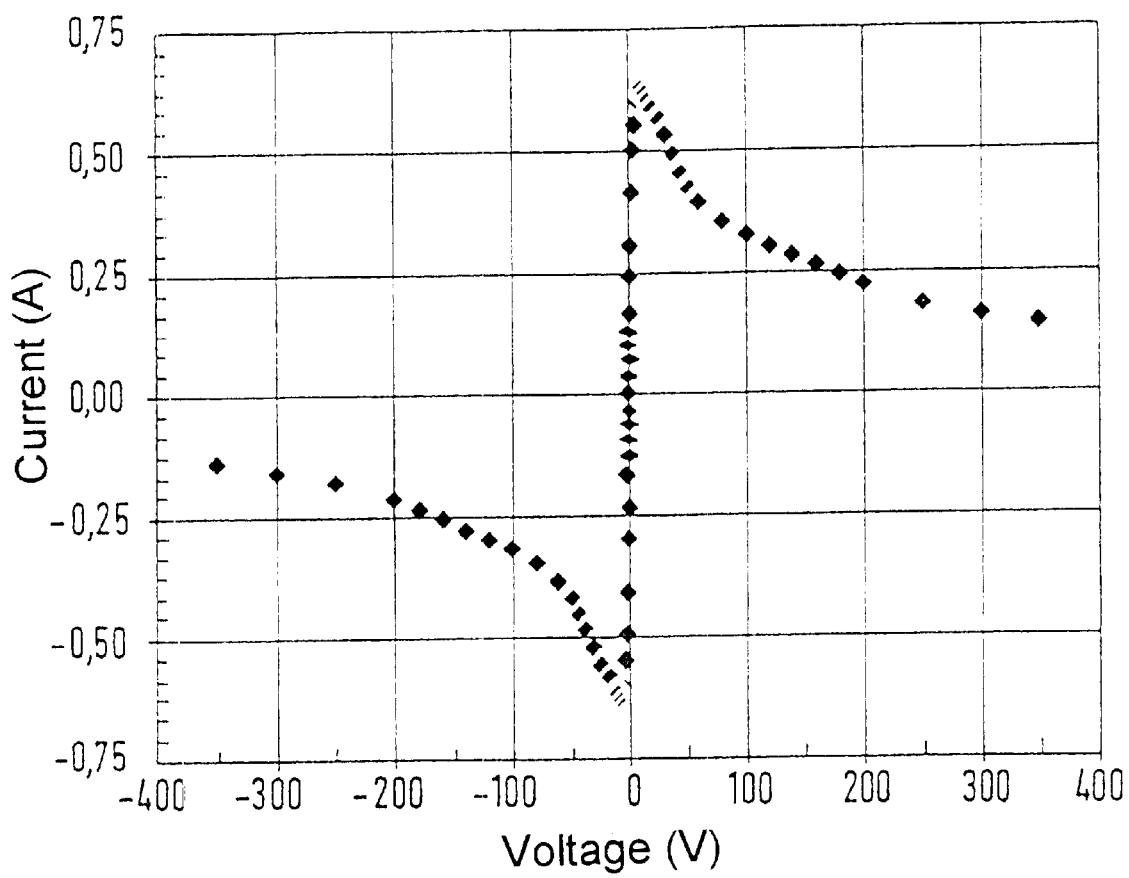
FIG. 5 is a graph plotting a measured characteristic curve for the AC limiter shown in FIG. 4.

The measured current-voltage characteristic curve for an AC limiter designed in SiC as shown in FIG. 4 is shown in FIG. 5. The characteristic curve shows the excellent suitability of the semiconductor configuration as a current-limiting component.

Figure 6:
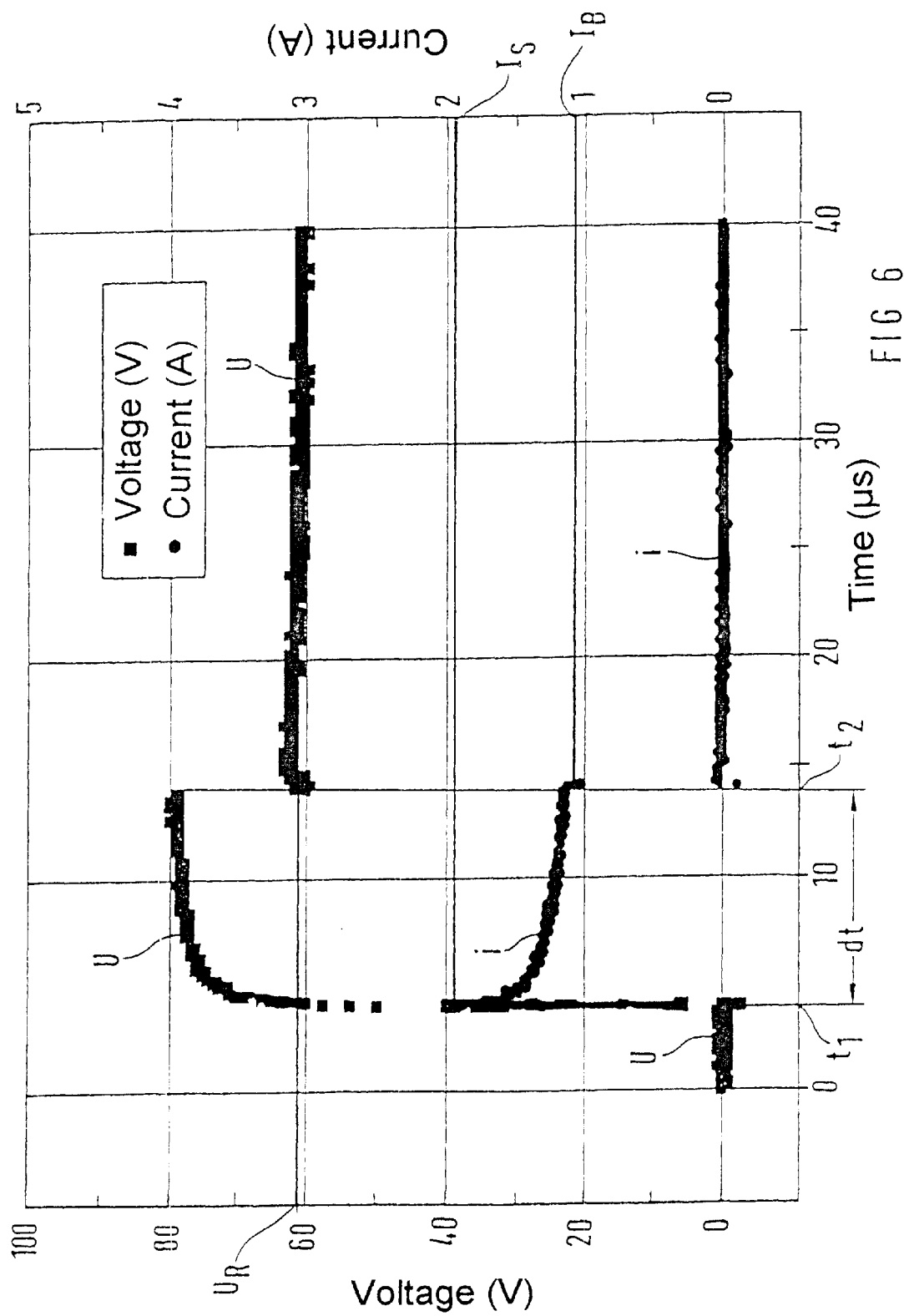
FIG. 6 is a graph of the current and voltage curves in a semiconductor configuration in the event of a short circuit.

FIG. 6 shows the measured curves for current I and voltage U in a semiconductor configuration, both plotted against time t. At the instant $t_1$, a voltage pulse of level 80 V and duration dt=10 μs was applied to the electrodes of the semiconductor configuration in a short circuit. The current I increases abruptly and, with a saturation current value $I_s$=2 A for the semiconductor configuration, is quickly limited within a few microseconds us to a reverse current $I_B$ of only about 1 A. After the voltage pulse has been turned off at the instant $t_2$, the current I naturally falls to 0 A again. What is of interest, however, is that the voltage U across the semiconductor configuration does not return to 0 V, but remains virtually constant at a residual voltage UR of about 60 V for more than 25 ms. This is an impressive illustration of the charge storage effect in the semiconductor regions 3 and 4 of the semiconductor configuration.

Figure 7:
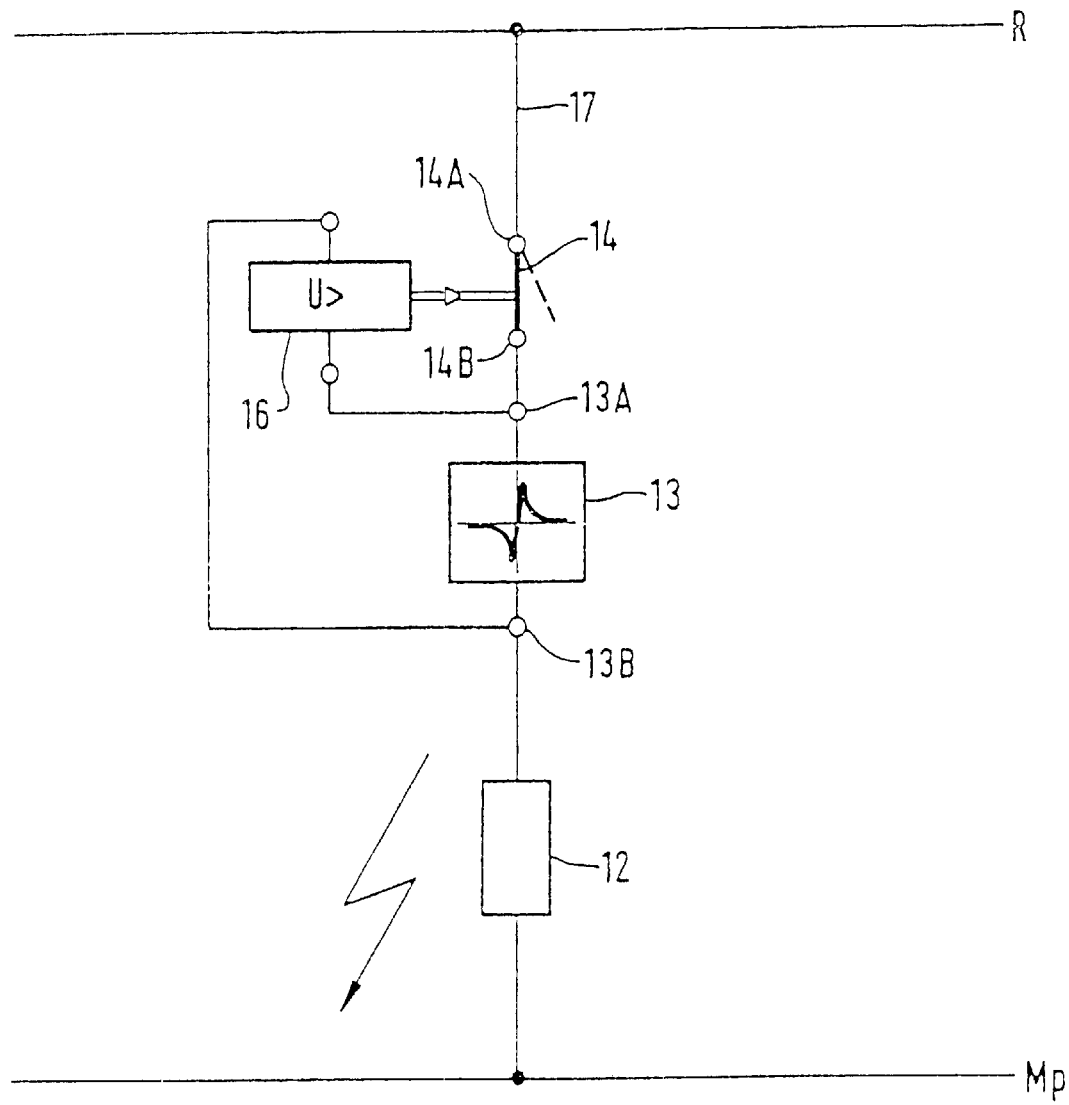
FIG. 7 is a circuit schematic of a switching device with a current limiter in a line branch.

Referring now to FIG. 7, there is shown a switching device in a line branch 17 between a phase R and ground potential Mp in an electrical supply network, for example a building installation, for an electrical consumer 12. The switching device comprises an electronic current limiter 13, which may be laid out as illustrated in any of FIGS. 1 to 4. The device further includes an overvoltage trigger 16, which taps off the voltage drop between two tap points 13A and 13B of the current limiter 13, and a switching relay 14 connected into the line branch 17 in series with the current limiter 13 upstream of the consumer 12. The switching relay 14 is triggered (opened) by the overvoltage trigger 16 if a limit voltage is exceeded at the current limiter 13, in order to achieve DC isolation of the consumer 12 from the network (R) in the event of a short circuit. In this case, the switching relay 14 does not need to be particularly fast, nor are its contacts affected by arcs during current limiting, because the electronic current limiter 13 limits the current very quickly in significantly less than a millisecond.

We claim:

1. A passive semiconductor configuration, comprising:
   a first electrode and a second electrode;
   a first semiconductor region having a first surface formed with at least one contact region in contact with said first electrode, having a second surface in contact with said second electrode, and defining a current path between said first and second electrodes;
   a second semiconductor region disposed to form a first p-n junction with said first semiconductor region and an associated depletion zone;
   a third semiconductor region disposed to form a second p-n junction with said first semiconductor region and an associated depletion zone, said third semiconductor region having a top surface not adjoining said first semiconductor region; and
   an insulator region covering said top surface of said third semiconductor region and insulating said third semiconductor region for charge storage charges in said third semiconductor region;
   said first semiconductor region being formed with at least one channel region in said current path between said first and second electrodes and, upon attaining a predetermined saturation current between said first and second electrodes, said depletion zones of said first and second p-n junctions passively pinching off said channel region and limiting the current to a value below the saturation current.

2. The semiconductor configuration according to claim 1, wherein said second semiconductor region is formed inside said first semiconductor region below said contact region and projects beyond said contact region in all directions parallel to said surface of said first semiconductor region.

3. The semiconductor configuration according to claim 1, wherein said third semiconductor region encloses said contact region parallel to said first surface of said first semiconductor region.

4. The semiconductor configuration according to claim 1, wherein said second surface of said first semiconductor region is remote from and facing away from said first surface.

5. The semiconductor configuration according to claim 1, wherein said at least one contact region is one of a plurality of contact regions on said first surface.

6. The semiconductor configuration according to claim 5, which comprises a cohesive second semiconductor region below said contact regions, said cohesive second semiconductor region projecting beyond all of said contact regions in all directions parallel to said first surface of said first semiconductor region.

7. The semiconductor configuration according to claim 5, wherein an associated said second semiconductor region is formed in said first semiconductor region below each of said contact regions.

8. The semiconductor configuration according to claim 6, wherein said first semiconductor region has channel regions running through respective openings formed in said cohesive second semiconductor region, said channel regions being electrically connected in series, in the current path, with at least one respective channel region associated with said contact regions.

9. The semiconductor configuration according to claim 4, wherein said first semiconductor region has channel regions running through respective openings formed in said second semiconductor region, said channel regions being electrically connected in series, in the current path, with at least one respective channel region associated with said contact regions.

10. The semiconductor configuration according to claim 4, wherein said first semiconductor region has channel regions running between said second semiconductor regions associated with said contact regions, said channel regions being electrically connected in series, in the current path, with at least one respective channel region associated with said contact regions.

11. The semiconductor configuration according to claim 7, wherein said first semiconductor region has channel regions running between said second semiconductor regions associated with said contact regions, said channel regions being electrically connected in series, in the current path, with at least one respective channel region associated with said contact regions.

12. The semiconductor configuration according to claim 5, which comprises a first electrode commonly connected to all said contact regions.

13. The semiconductor configuration according to claim 1, wherein said insulator region has a breakdown voltage of at least 20 V.

14. The semiconductor configuration according to claim 1, wherein said insulator region has a breakdown voltage of at least 50 V.

15. The semiconductor configuration according to claim 1, wherein said first, second, and third semiconductor regions are formed from silicon carbide.

16. The semiconductor configuration according to claim 1, wherein said insulator region is formed of silicon dioxide.

17. The semiconductor configuration according to claim 16, wherein said silicon dioxide is a thermally grown silicon dioxide.

* * * * *